US006334165B1

(12) United States Patent
Barenys et al.

(10) Patent No.: US 6,334,165 B1
(45) Date of Patent: Dec. 25, 2001

(54) ADDRESS TYPE DETERMINATION FOR AN I²C EEPROM

(75) Inventors: Michael Anton Barenys, Austin; William Eldred Beebe, Round Rock; Robert Allan Faust; Joel G. Goodwin, both of Austin, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/436,107

(22) Filed: Nov. 8, 1999

(51) Int. Cl.[7] .................................................. G06F 12/00
(52) U.S. Cl. .................................................. 711/103
(58) Field of Search .................................. 711/103, 104

(56) References Cited

PUBLICATIONS

Siemens AG, Standard EEPROM ICs–SLx24C01/02 1/2 Kbit Serial CMOS–EEPROM with I²C Synchronous 2–Wire Bus Data Sheet, Feb. 2, 1999, pp. 1–23.*

Siemens AG, Standard EEPROM ICs–SLx24C64 64 Kbit Serial CMOS–EEPROM with I²C Synchronous 2–Wire Bus Data Sheet, Feb. 2, 1999, pp. 1–28.*

* cited by examiner

*Primary Examiner*—David L. Robertson
(74) *Attorney, Agent, or Firm*—Joseph P. Lally; Mark E. McBurney (57) ABSTRACT

A method, system, and computer program product are disclosed for determining the address type of a serial EEPROM in an electronic system. The method includes reading data from at least one location of the EEPROM for a first time and saving the data for future reference. Thereafter, a sequence of transactions is executed that alters the contents of the EEPROM in a prescribed manner if the EEPROM is of a first type. The sequence of transaction leaves the EEPROM in an unaltered state if the EEPROM is of a second type. Data is then read from at least one location of the EEPROM for a second time. The location of the data read from the EEPROM the second time is the same as the location of the data read the first time if the EEPROM is of the first type. The data read the first time and the data read the second time are then compared. If it is determined that the data read the second time does not differ in the prescribed manner from the data read the first time, the type of the EEPROM is identified as the second type. In one embodiment, the indicate steps are repeated to achieve additional assurance that type of the EEPROM is the first type if it is determined that the data read the second time differs in the prescribed manner from the data read the first time. In one embodiment, reading data from the EEPROM for the first time includes, writing an initial byte to the EEPROM for a first time to set the address pointer to a known state if the EEPROM is of the first type. In one embodiment, the sequence of transactions include writing two bytes to the EEPROM, wherein the value of the first of the two bytes is the value of the initial byte written to the EEPROM. In one embodiment, the method includes, prior to reading data from the EEPROM for the first time writing two bytes to the EEPROM if is determined that the EEPROM is configured with an address type indicator field, where the two bytes comprise the 2-byte address of the indicator field in an EEPROM of the second type. In this embodiment, the two bytes of address type indicator information are read from the EEPROM. The contents of the two bytes are indicative of the address type of the EEPROM.

20 Claims, 4 Drawing Sheets

ADDRESS TYPE DETERMINATION FOR AN I²C EEPROM

BACKGROUND

1. Field of the Present Invention

The present invention is generally related to the field of semiconductor memories and more particularly to a method of determining the address type of a serial EEPROM.

2. History of the Related Art

Electrically erasable programmable read only memories (EEPROMs) provide an economical device in which to store product specific information. This product specific information can be used in numerous ways, including, as examples, product part number information, date of manufacture information, customization data, product serial number, etc. In one implementation, EEPROMs are incorporated into a system that utilizes an Inter IC bus (I²C bus). The I²C bus is a simple two line bus for interconnecting a variety of integrated circuits. For detailed information regarding the I²C bus, the reader is referred to the I²C *Bus Specification,* Version 2.0, Dec. 1998 from Phillips Semiconductors B.V. (www.semiconductors.phillips.com) P.O. Box 218, 5600 MD Eindhoven, The Netherlands, and to Paret et al, *The I²C Bus From Theory To Practice* (John Wiley & Son Ltd. 1997), ISBN No. 0471962686, both incorporated by reference herein. Various I²C compatible EEPROMs have identical pin-outs and differ only in their storage capacity and their storage address format. For example, I²C compatible EEPROMs are available in 1K and 65K capacities. The industry standard part designation number for the I²C compatible 1K EEPROM is 24C01 and the part number for the 65K I²C compatible EEPROM is 24C65. The pin-outs of the 24C01 and the 24C65 are identical and their function is the same except for one important difference. The 24C65 requires a 2-byte storage address while the 24C01 requires only a single address byte. When a product matures and outgrows a 1K part, a larger part such as the 65K part can be substituted with no hardware changes. The larger part, however, will require a second address byte. Consider the case where older products keep the small part and newer products employ the larger part. Software that will be installed on both the newer products and the older products must distinguish between the two types of devices because sending a 2-byte address to a small part will result an unintentional write cycle. This unintentional write cycle occurs because the small part expects only a single address byte and treats the next byte (the second address byte in the case of a 65K part) as data and writes it to the address indicated by the first address byte. It will be appreciated that unintentional writing of information to an EEPROM design to store product specific information is unacceptable. Similarly, sending a single address byte to a large part follow by a data byte does not achieve the desired function because the single address byte and the data byte are interpreted by the 2-byte part as a 2-byte address. Thus, the described sequence would result only in setting an address pointer of the large part to an address defined by the single address byte and the data byte. Therefore, it would be beneficial to implement a method and solution by which a system internally determines the type of EEPROM that it is addressing. It would be further desirable if the implemented system did not significantly increase the cost of the system, did not require extensive and complex software generation, and did not alter data stored in the EEPROM.

SUMMARY OF THE INVENTION

The identified issues are addressed in the present invention by a method, system, and computer program product for determining address type of a serial EEPROM in an electronic system. The method includes reading data from at least one location of the EEPROM for a first time and saving the data for future reference. Thereafter, a sequence of transactions is executed that alters the contents of the EEPROM in a prescribed manner if the EEPROM is of a first type. The sequence of transaction leaves the EEPROM in an unaltered state if the EEPROM is of a second type. Data is the read from at least one location of the EEPROM for a second time. The location of the data read from the EEPROM the second time is the same as the location of the data read the first time if the EEPROM is of the first type. The data read the first time and the data read the second time are then compared. If it is determined that the data read the second time does not differ in the prescribed manner from the data read the first time, the type of the EEPROM is identified as the second type. In one embodiment, the indicated steps are repeated to achieve additional assurance that the EEPROM is of the first type, if it is determined that the data read the second time differs in the prescribed manner from the data read the first time. In one embodiment, reading data from the EEPROM for the first time includes writing an initial byte to the EEPROM for a first time to set the address pointer to a known state if the EEPROM is of the first type. In one embodiment, the sequence of transactions include writing two bytes to the EEPROM, wherein the value of the first of the two bytes is the value of the initial byte written to the EEPROM. In one embodiment, the method includes, prior to reading data from the EEPROM for the first time, writing two bytes to the EEPROM if is determined that the EEPROM is configured with an address type indicator field, where the two bytes comprise the 2-byte address of the indicator field in an EEPROM of the second type. In this embodiment, the two bytes of address type indicator information are read from the EEPROM. The contents of the two bytes are indicative of the address type of the EEPROM.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF A PREFERRED EMBODIMENT OF THE PRESENT INVENTION

Figure 1:
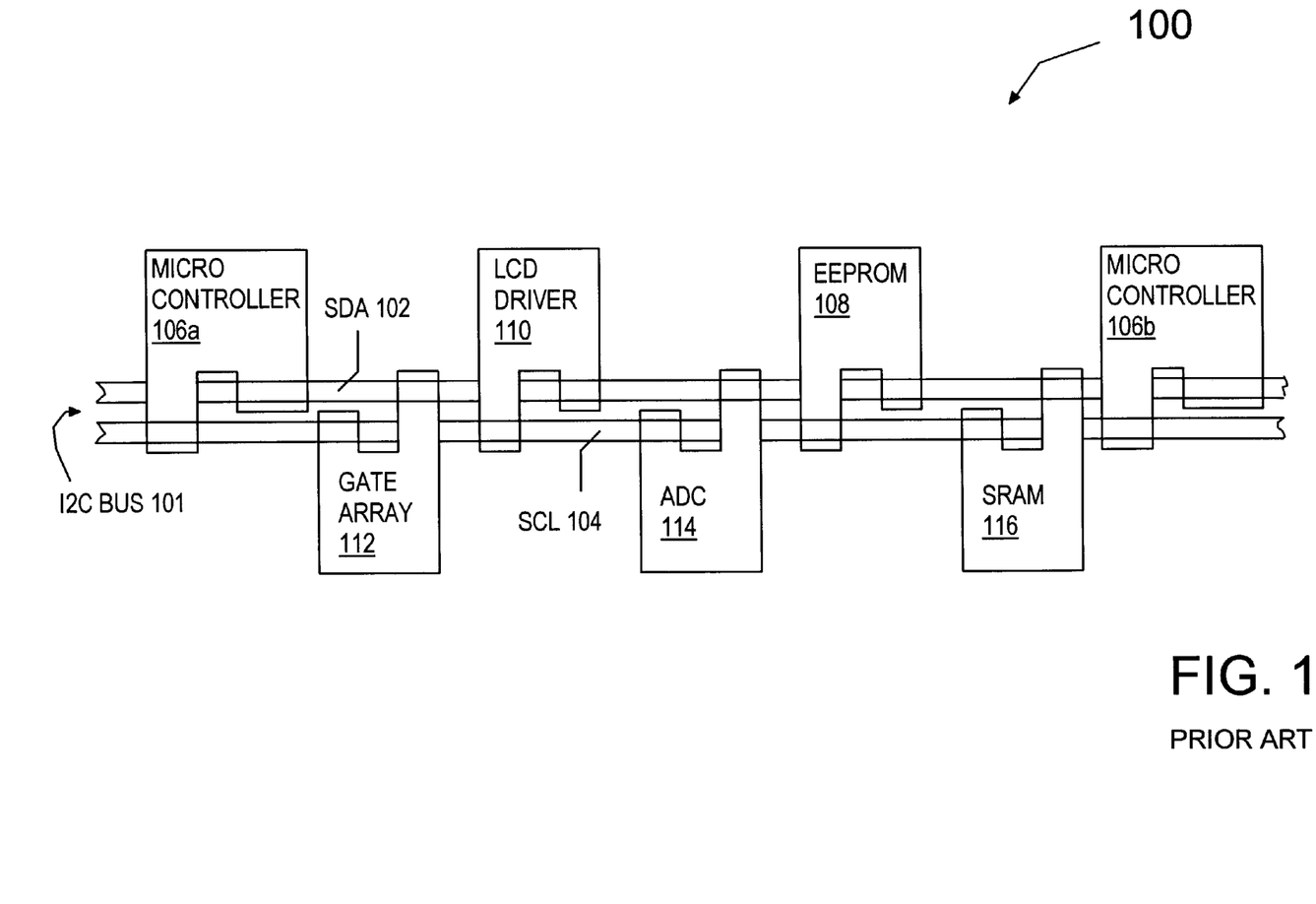
FIG. 1 is block diagram of an I²C compatible system.

Turning now to FIG. 1, an I²C compatible electronic system 100 is depicted. Information transfer in system 100 occurs over an I²C bus 101. I²C bus 101 includes an SDA (serial data/address) line 102 and SCL (serial clock) line 104 according to the I²C Bus Specification. The depicted embodiment of system 100 further includes one or more microcontrollers 106 (two of which are indicated by reference numerals 106a and 106b) and an I²C compatible EEPROM 108. Preferably, system 100 permits EEPROMs of various capacities to be used as EEPROM 108. In one embodiment, EEPROM 108 may be a 1K EEPROM such as a 24C01 serial EEPROM. In another embodiment, a 65K serial EEPROM such as a 24C65 device may be used as EEPROM 108. The depicted embodiment of system 100 in FIG. 1 further includes various other components such as, for example, an LCD driver 110 a gate array 112, an analog to digital converter (ADC) 114, and a SRAM 116. Typically, microcontrollers 106 act as masters of I²C bus 101. It will be appreciated that the components of system 100 depicted in FIG. 1 are merely representative of the type of components that may be connected in and I²C system. A wide variety of other configurations and devices are contemplated herein. The invention as described herein merely requires an I²C compatible EEPROM 108 and another device that can act as a master of I²C bus 101. I²C masters initiate transfers of information among the various components of system 100. Microcontroller 106 (or other masters of I²C bus 101) initiates I²C compliant transactions to store information in or retrieve information from slave devices such as EEPROM 108.

In a typical transaction involving EEPROM 108, a bus master such as microcontroller 106 initiates a transaction by asserting a start condition (defined by the bus specification) on I²C bus 101. Following the start condition, microcontroller 106 sends a control byte that identifies EEPROM 108 as the slave for this transaction. The last bit of the control byte controls whether the operation is a read operation or a write operation. This read/write bit (R/W) is set to 0 for write operations and set to 1 for read operations. Following the control byte, address and data information may be transferred. During a write operation, microcontroller 106 sends one or more address bytes to EEPROM 108 followed by one or more data bytes over SDA line 102. EEPROM 108 includes an internal address pointer that controls the location in the device's memory array to which the current operation pertains. The address pointer is set during a write operation with the first 1 or 2 bytes following the control byte. If the control byte R/W bit is set to 0 (for a write operation), the address pointer of EEPROM 108 is set based upon the following 1 or 2 bytes of data. Thus, it is conventional to speak of the method by which the address pointer is set as writing one or two address bytes to EEPROM 108. If the R/W bit of the control byte is set to 1, a read operation is indicated. No address is required or permitted for a read operation. Instead, EEPROM 108 outputs data to SDA line 102 from the location of the current address pointer onto I²C bus 101 in the cycles following the control byte.

As indicated previously, the packaging configuration including pin-count and pin-out are the same for the 1K EEPROM and the 65K EEPROM. Because the 65K device requires two address bytes, whereas the 1K device requires only a single address byte, problems can arise when writing to or reading from a serial EEPROM over an I²C bus such as I²C bus 101. More specifically, if the capacity of EEPROM 108 is not known prior to executing a write cycle, the second byte of information following the control byte will be interpreted differently depending upon the capacity of the EEPROM 108. If EEPROM 108 is a 65K device, the second byte following the control byte is interpreted as an address byte whereas, if EEPROM 108 is a 1K device, the second byte following the control byte is a data byte. Software written for system 100 must, therefore, determine the capacity and address format of the EEPROM 108 before attempting to transmit data to or receive data from the device. The present invention contemplate methods of determining the capacity and address format of serial EEPROMs on an I²C-Bus.

Figure 2:
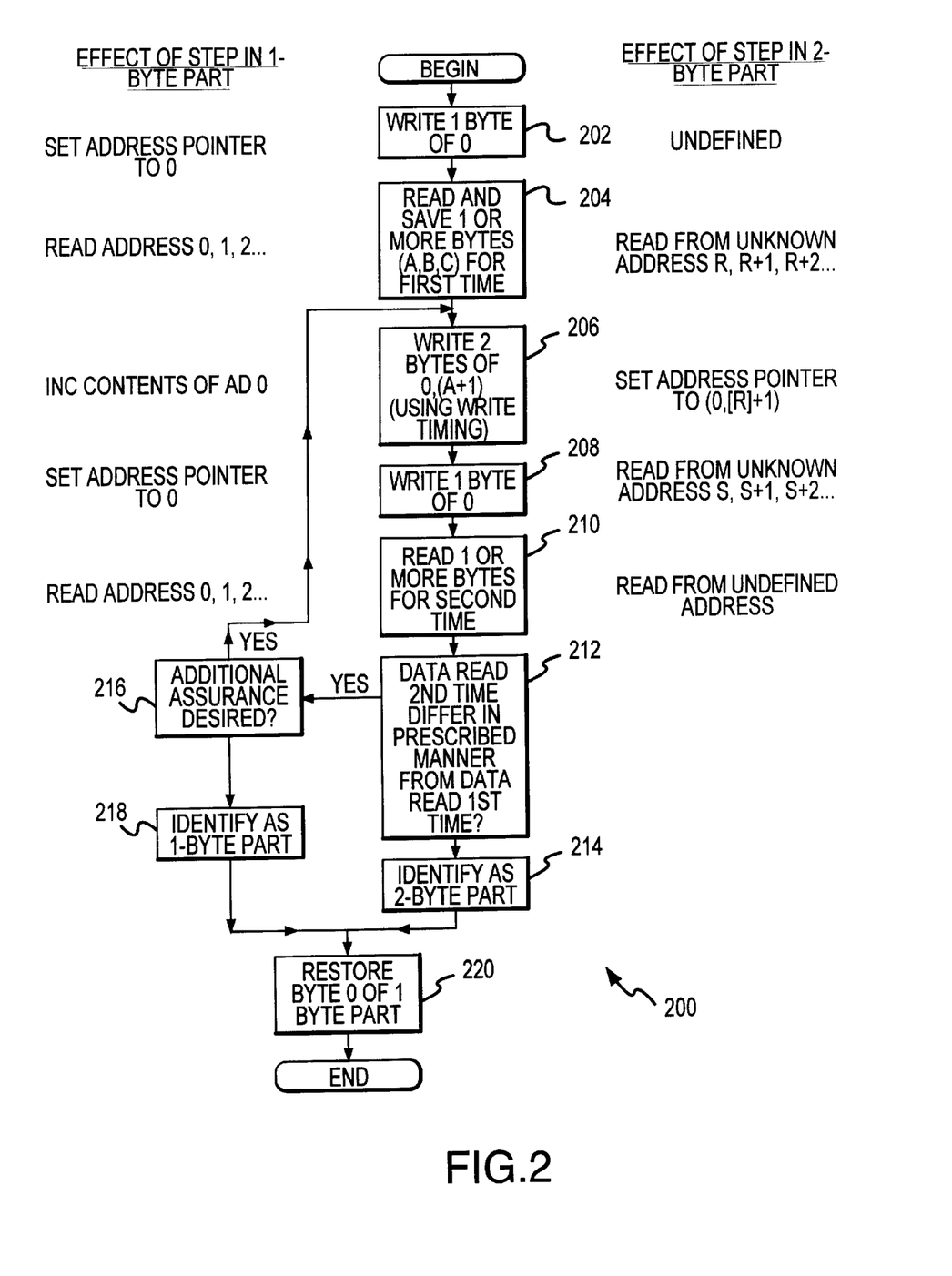
FIG. 2 is a flow diagram of a method of determining the address type of a serial EEPROM in the system of FIG. 1.

Turning now to FIG. 2, a flow diagram illustrating a method 200 of determining the address type of a serial EEPROM on an I²C bus is presented. The flow diagram is accompanied by notations on both sides of the flow diagram indicating the action that is taken with respect to a serial EEPROM requiring a 1 byte address (a 1-byte part) and a serial EEPROM requiring two address bytes (a 2-byte part). In an initial step 202 of the embodiment of method 200 depicted in FIG. 2, one address byte of 0 is written to EEPROM 108. The writing of one address byte of 0 is accomplished when a bus master, such as microcontroller 106, asserts a transaction start condition (specified by the I²C specification as a high-to-low transition on SDA line 102 when SCL line 104 is high) followed by a control byte identifying EEPROM 108 as the slave and including an R/W bit of 0. Following transfer of the control byte (and a single bit acknowledge cycle specified by the bus protocol), microcontroller 106 transfers 8 bits of information to EEPROM 108 where each bit is set to 0. After transferring the 8 bits of 0 to EEPROM 108, microcontroller 106 asserts a stop condition (a low to high SDA transition when SCL is high). As indicated in FIG. 2, the effect of step 202 for a 1-byte part is to set the address pointer in EEPROM 108 to 0. If, on the other hand, EEPROM 108 is a 2-byte part, step 202 leaves the address pointer in an undefined state because only 1 byte of address information was transferred in step 202.

In step 204, microcontroller 106 reads and saves one or, preferably, more bytes of information from EEPROM 108. Each of the multiple bytes of information that are read is saved in a random access memory device such as SRAM 116 of system 100 as depicted in FIG. 1. The saved information will be used to later verify the contents of a subsequent read operation as part of the process of determining the type of EEPROM 108 installed in system 100. Step 204 is accomplished when a bus master such as microcontroller 106 asserts a start condition followed by a control byte identifying EEPROM 108 and including an R/W bit set to 1. The address from which data is read is determined by the current state of the address pointer. After receiving such a sequence, EEPROM 108 sends data onto bus 101 in 8 bit blocks (each of the 8 bit blocks is separated by an acknowledge cycle). Multiple consecutive locations of EEPROM 108 are read by continuing to cycle SCL signal 104. Microcontroller 106 then terminates the read operation by asserting a stop condition. For a 1-byte part, step 204 comprises reading the contents of address location 0 (and one or more sequentially adjacent memory locations) from EEPROM 108 and storing them in RAM 116. In the example depicted in FIG. 2, step 204 reads three bytes of data from EEPROM locations 0, 1, and 2 containing the data values "A", "B", and "C" respectively. For the 2-byte part, step 204 consists of reading data from one or more undefined address locations because the address pointer was not properly set in step 202. The unknown addresses are represented in FIG. 2 by the address R, R+1, and R+2 and their respective data values are represented by "X", "Y", and "Z".

In step 206, a 2 byte write cycle is initiated by asserting a start condition, issuing a control word identifying EEPROM 108 and containing a R/W bit set to 0, and followed by two 8 bit values. In the embodiment exemplified in FIG. 2, the value of the first byte following the control byte is 0 while the value of the second byte transmitted via I²C bus 101 equals the value read from EEPROM 108 in step 204 incremented by one. Thus, if the value read from EEPROM 108 in step 204 was equal to ASCII "A", then the value of the second byte following the control byte in step 206 is set to ASCII "A"+1 (i.e., ASCII "B"). In a 1-byte part, step 206 results in incrementing the contents of memory location 0 of EEPROM 108 because the first byte sets the address pointer to 0 and the second byte constitutes the data written into address location 0. In order for this data write operation to take place properly, sufficient write time must be allowed. For the 2-byte part, however, step 206 merely results in the setting of the address pointer because both of the bytes following the control byte are treated as address bytes. Thus, in the 2-byte part, step 206 sets the address pointer to location (0, X+1), where X is the value that was read from EEPROM 108 in step 204.

It will be appreciated that, in a 1-byte part, steps 202, 204, and 206 read a set of memory locations and increment the contents of the first memory location that was read. For a 2-byte part, the same steps do not alter the stored data in EEPROM 108. This distinction is utilized in the present invention to determine the address type of EEPROM 108. In step 208, one address byte of 0 is written to EEPROM 108 in a manner identical to the operation of step 202. Like step 202, step 208 results in setting the address pointer to 0 for a 1-byte part and setting the address pointer to an undefined state for a 2-byte part. In step 210, one or more bytes are read from EEPROM 108 in the same manner as in step 204 described previously. For the 1-byte part, step 210 reads the contents of locations 0, 1, and 2 (for the depicted example). For a 2-byte part, step 210 reads data from one or more unknown locations indicated in FIG. 2 as S, S+1, and S+2 to indicate that the locations read in step 210 for a 2-byte part are not necessarily the same as the locations read in step 204. In step 212, the data read from EEPROM 108 in step 204 is compared with the data read in step 210. If EEPROM 108 is a 1-byte part, the data read in step 212 will vary from the data read in step 204 in a prescribed manner. More specifically, the data read in step 212 will be identical to the data read in step 204 except that the value of the first data location is incremented by one. If, for example, three bytes of information were read from EEPROM 108 in step 204 and the three bytes contained the data "A", "B", and "C", the data read during step 210 will be "B", "B", and "C" (assuming EEPROM 108 is fully functional). If the data read during step 210 does not vary from the data read in step 204 in the prescribed manner, EEPROM 108 must be a 2-byte part. Accordingly, if data from step 210 is the same as the data read from step 204 or if the data from step 210 varies from the data read in step 204 in any manner other than an increment in the first location, then EEPROM 108 must be a 2-byte part and the part is identified as such in step 214.

If the data read from step 210 varies in the prescribed manner with respect to the data in step 204, then there is a high likelihood that EEPROM 108 is a 1-byte part. Nevertheless, there exists the possibility, that, through sheer coincidence, a segment of data was read from an unknown location in a 2-byte part in step 210 that happened to vary from the data read from another unknown location in step 204 in the prescribed manner. Although this possibility is remote, a decision step 216 is preferably included in method 200 upon determining that the data read in step 210 varies from the data read in step 204 in the prescribed manner. In step 216, it is determined whether an additional iteration of the process is to be executed to provide further assurance that the part is a 1-byte part. In one embodiment, decision step 216 comprise simply determining whether comparison step 212 has been executed at least two times. In any event, if additional assurance is desired, the depicted embodiment of method 200 re-executes steps 206, 208, and 210 to increment again (i.e., what was originally "ABC" as discussed previously now becomes "CBC") the contents of the first memory location in a 1-byte part while leaving the contents of the 2-byte part unaffected. If, during the second or subsequent iteration of comparison step 212, the contents of the first memory location have been incremented from their previous value while the remaining memory locations remain the same, further assurance that the device is a 1-byte part is provided. In this manner, the probability of falsely identifying an EEPROM 108 as a 1-byte part when it is actually a 2-byte part can be reduced to an acceptable level by repeatedly executing the described loop. When no additional assurance that EEPROM 108 comprises a 1-byte part is desired, the EEPROM 108 is identified as 1-byte part in step 218. After determining the address type of EEPROM 108, a final step 220 can be included in which the contents of memory location 0 are restored to an original condition such that method 200 reads the contents of EEPROM 108 in its original state.

Figure 3:
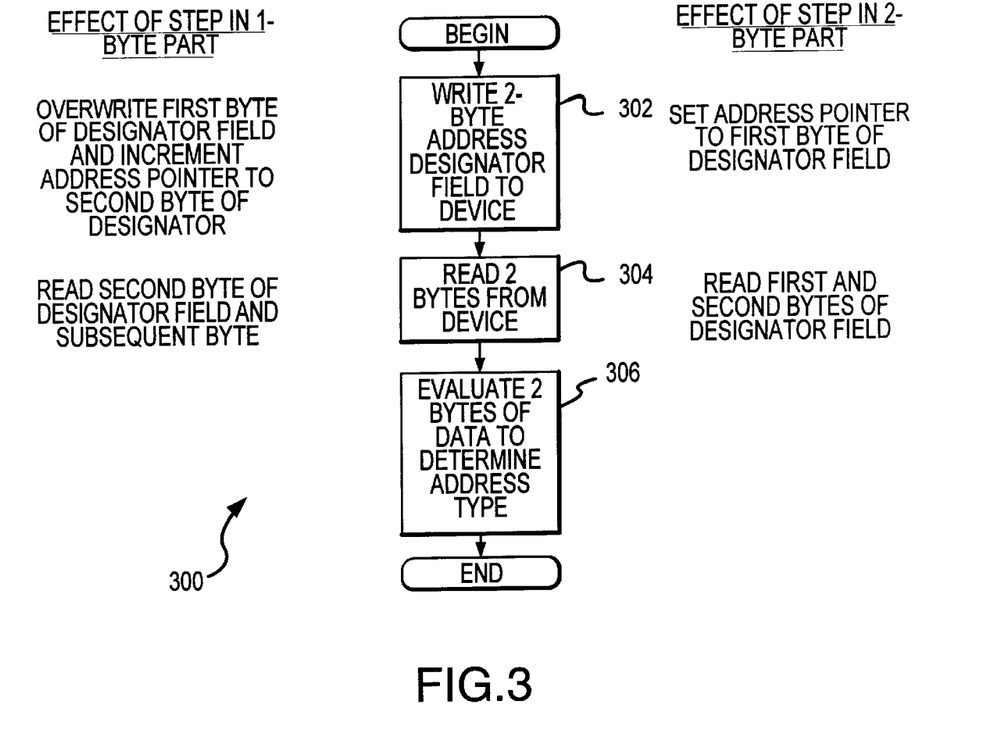
FIG. 3 is a flow diagram of an alternative method of detecting address types in serial EEPROM.
Figure 4:
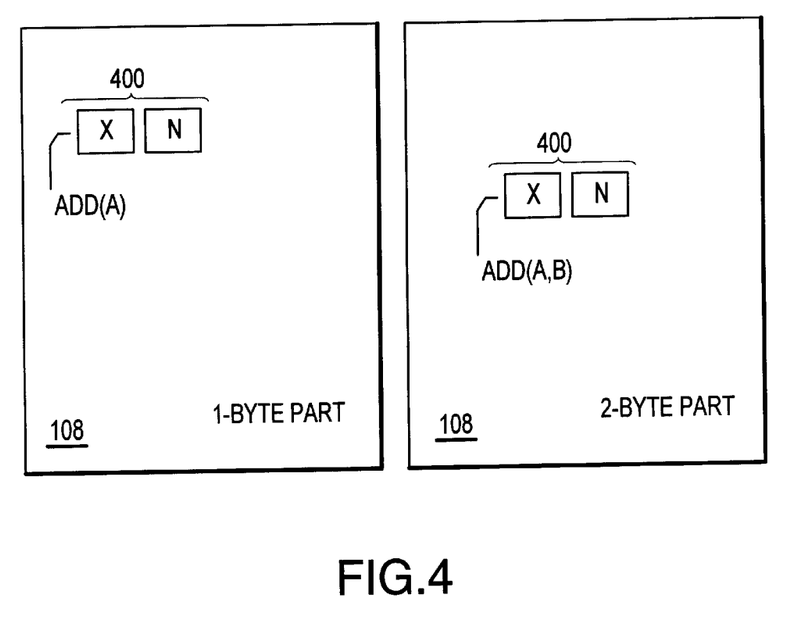
FIG. 4 is a simplified block diagram of a serial EEPROM configured with an address type indicator field according to the present invention.
Figure 5:
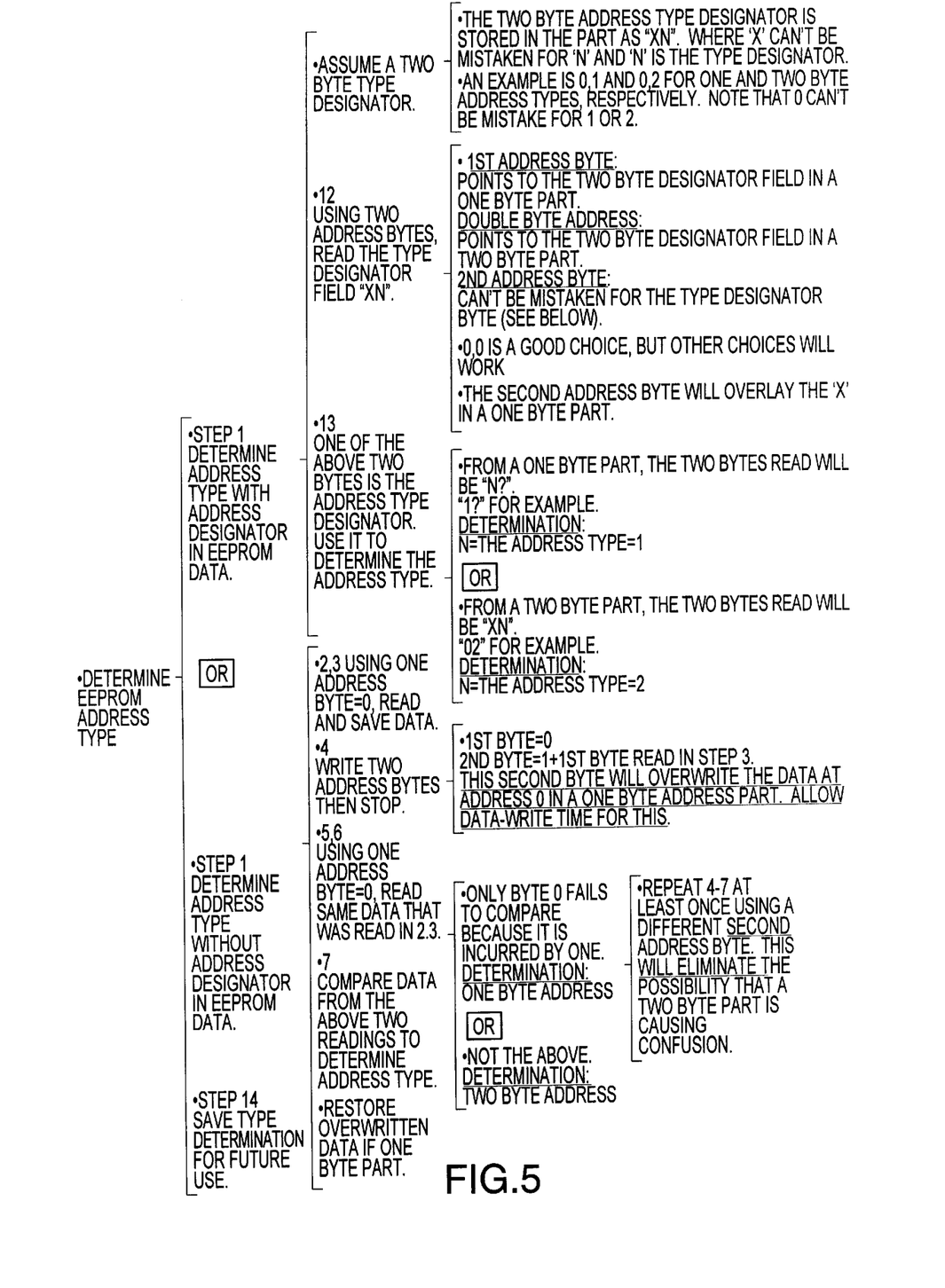
FIG. 5 is a chart illustrating addressing type determination for a serial EEPROM according to an embodiment of the present invention.

Turning now to FIG. 3, a flow diagram indicating a method 300 of determining the capacity and address type of EEPROM 108 is depicted in an embodiment in which a 2-byte address type indicator is stored in a designated address type field of the part indicated by reference numeral 400 in FIG. 4. In this embodiment, the address type indicator is stored in EEPROM 108 by the user to indicate the address type of the device. In the preferred embodiment, the value of the address type indicator is (X,N) where X represents the data stored in the first byte of field 400 and N is the value of the data stored in the second byte of indicator field 400. In one embodiment, the value N indicates the address type of EEPROM 108, and the value X is constrained not to equal any of the possible values of N. The address of indicator field 400 is specified as a 2-byte value by the user and must be such that the first byte of the indicator field address points to the indicator field in a 1-byte part, the first and second bytes together point to the field in a 2-byte part. In the illustrated example, the designator field is specified as the address (A,B) where A is the address location of designator field 400 in a 1-byte part and (A,B) is the 2-byte address of designator field 400 in a 2-byte part. In addition, and the second byte of the specified indicator field address cannot equal any values that the N indicator can assume. Consider, as an example, a situation in which one of two address type parts is available for use as EEPROM 108, namely, a 1-byte part and a 2-byte part. The user assigns address type indicator values for both types of parts. Assume for purposes of this example that N is specified as 1 for a 1-byte part and 2 for a 2-byte part. In this example, X can be any value other than 1 or 2. The user also specifies a 2-byte address for address indicator field 400, where the first byte is the address of field 400 in a 1-byte part and the first and second bytes indicate the address field 400 in a 2-byte part. The address used in this example is 0,0, which complies with the constraint that the second byte of the address field cannot equal any possible value of N (namely, 1 or 2 in this example). To determine the address type of an EEPROM 108 that includes indicator field 400, the 2 byte indicator field address is written to the part in step 302. In the example, the two address bytes written to EEPROM 108 are 0, 0. In the 2-byte part, step 302 results in setting the address pointer to the first byte of indicator field 400. In the 1-byte part, step 302 results in overriding the first byte (the X byte) of address type indicator field 400 with 0 (and incrementing the address pointer to the second byte of the field). In step 304, 2 bytes of data are read EEPROM 108. In a 2-byte part, step 304 results in reading the values X, N from EEPROM 108. In the 1-byte part, step 304 results in reading the values N, R from locations 1 and two of the 1-byte part (where R is a random number). In step 306, the values read from EEPROM 108 in step 304 are evaluated. Because of the constraints imposed on the values of X,N and the address of indicator field 400, inspection of the 2 byte field read in step 304 is determinative of whether the EEPROM 108 is a 1-byte part or a 2-byte part. More specifically, if the first byte read in step 304 is equal to the N value reserved for a 1-byte part (1 in this example) the device is a 1-byte part, otherwise, the device is a 2-byte part. Thus, by dedicating 2 bytes of the memory array in EEPROM 108, the embodiment of method 300 depicted in FIG. 3 may be implemented to determine the proper address type format of the EEPROM in any given $I^2C$ system 100. The chart of FIG. 5 illustrates, in a combined format, the process of determining addressing type for a serial EEPROM device as described in the discussion of FIG. 2 and FIG. 3.

It will be appreciated by those skilled in the art having the benefit of this disclosure that the present invention contemplates alternative methods of determining the capacity and address type format of an electronic device such as an EEPROM in a system utilizing an $I^2C$ bus. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A method of determining the address type of a serial EEPROM, comprising, reading data from at least one location of the EEPROM for a first time and saving the data for future reference;

executing a sequence of transactions that alters the contents of the EEPROM in a prescribed manner if the EEPROM is of a first type, but leaves the EEPROM in an unaltered state if the EEPROM is of a second type;

reading data from at least one location of the EEPROM for a second time, wherein the at least one location read the second time is the same as the at least one location read the first time if the EEPROM is of the first type; and comparing the data read the first time and the data read the second time and, responsive to determining that the data read the second does not differ in the prescribed manner from the data read the first time, identifying the type of the EEPROM as the second type.

2. The method of claim 1, further comprising, responsive to determining that the data read the second time differs in the prescribed manner from the data read the first time, repeating the method of claim A to achieve additional assurance that type of the EEPROM is the first type.

3. The method of claim 1, wherein reading data from the EEPROM for the first time includes, writing an initial byte to the EEPROM for a first time to set the address pointer to a known state if the EEPROM is of the first type.

4. The method of claim 3, wherein the sequence of transactions include writing two bytes to the EEPROM, wherein the value of the first of the two bytes is the value of the initial byte written to the EEPROM.

5. The method of claim 4, wherein the value of the second of the two bytes written to the EEPROM is incremented by one from the first value read from the EEPROM when the EEPROM was read for the first time.

6. The method of claim 1, wherein the EEPROM of the first type is a 1-byte part and the EEPROM of the second type is a 2-byte part.

7. The method of claim 1, further comprising, prior to reading data from the EEPROM for the first time:

writing two bytes to the EEPROM responsive to determining that the EEPROM is configured with an address type indicator field, wherein the two bytes comprise the 2-byte address of the indicator field in an EEPROM of the second type; and reading two bytes of address type indicator information from the EEPROM, wherein the contents of the two bytes are indicative of the address type of the EEPROM.

8. An electronic system, including at least one controller, a serial EEPROM connected to the at least one controller, and a random access storage medium accessible to the controller, wherein the random access storage medium is configured with a set of instructions executable by the controller, the set of instruction comprising:

means for reading data from at least one location of the EEPROM for a first time and saving the data for future reference;

means for executing a sequence of transactions that alters the contents of the EEPROM in a prescribed manner if the EEPROM is of a first type, but leaves the EEPROM in an unaltered state if the EEPROM is of a second type;

means for reading data from at least one location of the EEPROM for a second time, wherein the at least one location read the second time is the same as the at least one location read the first time if the EEPROM is of the first type; and means for comparing the data read the first time and the data read the second time and, responsive to determining that the data read the second does not differ in the prescribed manner from the data read the first time, identifying the type of the EEPROM as the second type.

9. The system of claim 8, further comprising, means for repeating the means of claim 9, responsive to determining that the data read the second time differs in the prescribed manner from the data read the first time, to achieve additional assurance that type of the EEPROM is the first type.

10. The system of claim 8, wherein the means for reading data from the EEPROM for the first time includes means for writing an initial byte to the EEPROM for a first time to set the address pointer to a known state if the EEPROM is of the first type.

11. The system of claim 10, wherein the means for executing the sequence of transactions include means for writing two bytes to the EEPROM, wherein the value of the first of the two bytes is the value of the initial byte written to the EEPROM.

12. The system of claim 11, wherein value of the second of the two bytes written to the EEPROM is incremented by one from the first value read from the EEPROM when the EEPROM was read for the first time.

13. The system of claim 8, wherein the controller is connected to the EEPROM via an $I^2C$ bus.

14. The system of claim 8, further comprising:

means for writing two bytes to the EEPROM prior to reading data from the EEPROM for the first time responsive to determining that the EEPROM is configured with an address type indicator field, wherein the two bytes comprise the 2-byte address of the indicator field in an EEPROM of the second type; and means for reading two bytes of address type indicator information from the EEPROM, wherein the two bytes of address type indicator information is indicative of the address type of the EEPROM.

15. A computer program product comprising a computer readable medium configured with a set of instructions for determining the address type of a serial EEPROM, the instructions comprising:

means for reading data from at least one location of the EEPROM for a first time and saving the data for future reference;

means for executing a sequence of transactions that alters the contents of the EEPROM in a prescribed manner if the EEPROM is of a first type, but leaves the EEPROM in an unaltered state if the EEPROM is of a second type;

means for reading data from at least one location of the EEPROM for a second time, wherein the at least one location read the second time is the same as the at least one location read the first time if the EEPROM is of the first type; and means for comparing the data read the first time and the data read the second time and, responsive to determining that the data read the second does not differ in the prescribed manner from the data read the first time, identifying the type of the EEPROM as the second type.

16. The computer program product of claim 15, further comprising, means for repeating the, means of claim 15, responsive to determining that the data read the second time differs in the prescribed manner from the data read the first time, to achieve additional assurance that type of the EEPROM is the first type.

17. The computer program product of claim 15, wherein the means for reading data from the EEPROM for the first time includes means for writing an initial byte to the EEPROM for a first time to set the address pointer to a known state if the EEPROM is of the first type.

18. The computer program product of claim 17, wherein the means for executing the sequence of transactions include means for writing two bytes to the EEPROM, wherein the value of the first of the two bytes is the value of the initial byte written to the EEPROM.

19. The computer program product of claim 18, wherein value of the second of the two bytes written to the EEPROM is incremented by one from the first value read from the EEPROM when the EEPROM was read for the first time.

20. The computer program product of claim 15, further comprising:

means for writing two bytes to the EEPROM prior to reading data from the EEPROM for the first time responsive to determining that the EEPROM is configured with an address type indicator field, wherein the two bytes comprise the 2-byte address of the indicator field in an EEPROM of the second type; and means for reading two bytes of address type indicator information from the EEPROM, wherein the two bytes of address type indicator information is indicative of the address type of the EEPROM.

* * * * *

UNITED STATES PATENT AND TRADEMARK OFFICE
CERTIFICATE OF CORRECTION

PATENT NO. : 6,334,165 B1  Page 1 of 2
DATED : December 25, 2001
INVENTOR(S) : Michael Anton Barenys, William Eldred Beebe, Robert Allan Faust and Joel G. Goodwin It is certified that error appears in the above-identified patent and that said Letters Patent is hereby corrected as shown below:

In column 7, lines 36-59, column 8, lines 44-48 and column 9, lines 9-32 should read as follows:

1. A method of determining the address type of a serial EEPROM, comprising,         reading data from at least one location of the EEPROM for a first time and saving the data for future reference;

executing a sequence of transactions that alters the contents of the EEPROM in a prescribed manner if the EEPROM is of a first type, but leaves the EEPROM in an unaltered state if the EEPROM is of a second type;

reading data from at least one location of the EEPROM for a second time, wherein the at least one location read the second time is the same as the at least one location read the first time if the EEPROM is of the first type; and         comparing the data read the first time and the data read the second time and, responsive to determining that the data read the second time does not differ in the prescribed manner from the data read the first time, identifying the type of the EEPROM as the second type.

2. The method of claim 1, further comprising, responsive to determining that the data read the second time differs in the prescribed manner from the data read the first time, repeating the method of claim 1 to achieve additional assurance that type of the EEPROM is the first type.

9. The system of claim 8, further comprising, means for repeating the means of claim 8, responsive to determining that the data read the second time differs in the prescribed manner from the data read the first time, to achieve additional assurance that type of the EEPROM is the first type.

UNITED STATES PATENT AND TRADEMARK OFFICE
CERTIFICATE OF CORRECTION

PATENT NO.     : 6,334,165 B1
DATED          : December 25, 2001
INVENTOR(S)    : Michael Anton Barenys, William Eldred Beebe, Robert Allan Faust and
                 Joel G. Goodwin It is certified that error appears in the above-identified patent and that said Letters Patent is hereby corrected as shown below:

15. A computer program product comprising a computer readable medium configured with a set of instructions for determining the address type of a serial EEPROM, the instructions comprising:

means for reading data from at least one location of the EEPROM for a first time and saving the data for future reference;

means for executing a sequence of transactions that alters the contents of the EEPROM in a prescribed manner if the EEPROM is of a first type, but leaves the EEPROM in an unaltered state if the EEPROM is of a second type;

means for reading data from at least one location of the EEPROM for a second time, wherein the at least one location read the second time is the same as the at least one location read the first time if the EEPROM is of the first type; and means for comparing the data read the first time and the data read the second time and, responsive to determining that the data read the second time does not differ in the prescribed manner from the data read the first time, identifying the type of the EEPROM as the second type.

16. The computer program product of claim 15, further comprising, means for repeating the means of claim 15, responsive to determining that the data read the second time differs in the prescribed manner from the data read the first time, to achieve additional assurance that type of the EEPROM is the first type.

Signed and Sealed this

Second Day of July, 2002

*Attest:*

*Attesting Officer*

JAMES E. ROGAN
*Director of the United States Patent and Trademark Office*